(12) United States Patent
Mouli

(10) Patent No.: US 6,872,640 B1
(45) Date of Patent: Mar. 29, 2005

(54) SOI CMOS DEVICE WITH REDUCED DIBL

(75) Inventor: Chandra V. Mouli, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/801,993

(22) Filed: Mar. 16, 2004

(51) Int. Cl.$^7$ .............................................. H01L 21/425
(52) U.S. Cl. ....................... 438/514; 438/542; 438/290; 438/217; 257/347
(58) Field of Search .................................. 438/510, 514, 438/542, 289, 290, 149, 217; 257/347, 285, 391

(56) References Cited

U.S. PATENT DOCUMENTS

| | | |
|---|---|---|
| 4,199,773 A | 4/1980 | Goodman et al. |
| 5,024,965 A | 6/1991 | Chang et al. |
| 5,112,766 A * | 5/1992 | Fujii et al. .................. 438/179 |
| 5,164,805 A | 11/1992 | Lee |
| 5,166,765 A | 11/1992 | Lee et al. |
| 5,231,045 A | 7/1993 | Miura et al. |
| 5,315,144 A | 5/1994 | Cherne |
| 5,501,993 A | 3/1996 | Borland |
| 5,528,063 A * | 6/1996 | Blanchard ................... 257/335 |
| 5,599,728 A | 2/1997 | Hu et al. |
| 5,614,433 A | 3/1997 | Mandelman |
| 5,930,630 A * | 7/1999 | Hshieh et al. .............. 438/268 |
| 5,942,781 A | 8/1999 | Burr et al. |
| 5,960,275 A * | 9/1999 | So et al. ..................... 438/211 |
| 6,037,617 A | 3/2000 | Kumagai |
| 6,268,630 B1 | 7/2001 | Schwank et al. |
| 6,503,783 B1 | 1/2003 | Mouli |
| 2002/0089032 A1 * | 7/2002 | Huang ........................ 257/507 |

OTHER PUBLICATIONS

Park et al., "Dopant Redistribution in SOI during RTA: A Study on Doping in Scaled–down Si Layers", *IEEE*, 1999, pp 14.2.1 through 14.2.4.
"A.1.3.2 Spurious Effects In Sub–Micron MOSFETs", http://www.iue.tuwien.ac.at/diss/schrom/diss/node90.html.
"2.7.2 Threshold Control", http://www.iue.tuwien.ac.at/diss/schrom/diss/node26.html.
"Random discrete dopant fluctuation; Ultra–thin channel SOI", http://www.research.ibm.com/0.1um/pwong.html.

* cited by examiner

Primary Examiner—Amir Zarabian
Assistant Examiner—Thanh Y. Tran
(74) Attorney, Agent, or Firm—Knobbe, Martens, Olson & Bear, LLP

(57) ABSTRACT

CMOS devices formed with a Silicon On Insulator (SOI) technology with reduced Drain Induced Barrier Lowering (DIBL) characteristics and a method for producing the same. The method involves a high energy, high dose implant through openings in a masking layer and through channel regions of the p- and n-wells, into the insulator layer, thereby creating a borophosphosilicate glass (BPSG) diffusion source within the insulation layer underlying the gate regions of the SOI wafer substantially between the source and drain. Backend high temperature processing steps induce diffusion of the dopants contained in the diffusion source into the p- and n-wells, thereby forming asymmetric retrograde dopant profiles in the channel under the gate. The method can be selectively applied to selected portions of a wafer to tailor device characteristics, such as for memory cells.

38 Claims, 11 Drawing Sheets

T.A Fjeldly, T.Ytterdal, M.S. Shur, *Introduction to Device Modeling and Circuit Simulation*, Wiley, New York, 1998

A RETROGRADED DOPANT PROFILE

CONVENTIONAL (NON-RETROGRADED) DOPANT PROFILE

SOI CMOS DEVICE WITH REDUCED DIBL

BACKGROUND OF THE INVENTION

1. Field of the Invention

The invention relates to the field of semiconductor devices and fabrication processes and, in particular, to CMOS devices formed in a silicon-on-insulator (SI) technology with improved avoidance of short channel effects, such as reduced drain induced barrier lowering (DIBL) and a method for fabricating the same, including arrays of memory cells with peripheral logic circuits.

2. Description of the Related Art

There is an ever-present desire in the semiconductor fabrication industry to achieve individual devices with smaller physical dimensions. Reducing the dimensions of devices is referred to as scaling. Scaling is desirable in order to increase the number of individual devices that can be placed on a given area of semiconductor material and to reduce the unit cost and the power consumption of individual devices. In addition, scaling can result in performance increases of the individual devices as the charge carriers, having a finite velocity, have a shorter distance to travel and less bulk material has to accumulate or dissipate charges, thus leading to increased operating frequency. Thus, the trend in the industry is to scale towards thinner device regions and gate oxides, shorter channels, and lower power consumption.

However, scaling often creates some performance drawbacks. In particular, a known category of performance limitations known as short channel effects arise as the length of the channel of CMOS devices is reduced by scaling. One particular short-channel effect in CMOS devices, known as Drain Induced Barrier Lowering (DIBL) is mainly responsible for the degradation of sub-threshold swing in deep sub-micron devices. DIBL is a reduction in the potential barrier between the drain and source as the channel length shortens as illustrated in FIG. 1 reflecting known prior art. When the drain voltage is increased, the depletion region around the drain increases and the drain region electric field reduces the channel potential barrier which results in an increased off-state or leakage current between the source and drain.

In CMOS devices, a retrograde channel dopant profile can be effectively used to control DIBL. In a CMOS process, n-type and p-type wells are created for NMOS and PMOS devices. In a conventional diffusion process, dopant concentration profiles in these n- and p-type wells are at a peak near the surfaces and decrease in the depth direction into the bulk as illustrated in FIG. 2. A retrograde profile is one in which the peak of the dopant concentration profile is not at the surface but at some distance into the bulk as shown in FIG. 3. Such retrograde profiles are helpful in deep sub-micron CMOS devices since they reduce the lowering of the source/drain barrier when the drain is biased high and when the channel is in weak inversion. This limits the amount of subthreshold leakage current flowing into the drain. A lower level of subthreshold leakage current provides improved circuit reliability and reduced power consumption.

A retrograde dopant profile also typically results in a lower dopant concentration near the surface of the wafer which reduces junction capacitances. Reduced junction capacitances allow the device to switch faster and thus increase circuit speed. Typically, retrograde profile dopant implants are done after formation of the gate. A halo (or pocket) implant is another known method used in deep sub-micron CMOS devices to reduce DIBL.

However in some applications, such as in an SOI process, it is difficult to create a retrograde profile due to the thinness of the silicon layer and the tendency of the dopants to diffuse. SOI processes employ a buried insulating layer, typically of silicon dioxide with a very thin silicon (Si) film (typically <1600 Å) overlying the oxide in which the active devices are formed. One difficulty encountered in SOI processes is that increasing the Si film thickness to facilitate forming a retrograde profile will increase the extent to which the devices formed therein get partially depleted. SOI devices also suffer from 'floating body' effects since, unlike conventional CMOS, in SOI there is no known easy way to form a contact to the bulk in order to remove the bulk charges.

Another difficulty is that when as-implanted retrograde dopant profiles diffuse during subsequent heat cycles in a process, they tend to spread out and lose their 'retrograde' nature to some extent. In SOI, since the silicon film is very thin, creating and maintaining a true retrograde dopant profile is very difficult. This is true even while using higher atomic mass elements like Indium (In) for NMOS and Antimony (Sb) for PMOS as channel dopants. Diffusivity of these dopants in silicon is known to be comparable to lower atomic mass elements like boron (B) and phosphorus (P), when the silicon film is very thin, as in an SOI technology. Moreover, leakage current levels are known to increase when Indium is used for channel dopants (See "Impact of Channel Doping and Ar Implant on Device Characteristics of Partially Depleted SOI MOSFETs", Xu et al., pp. 115 and 116 of the Proceedings 1998 IEEE International SOI Conference, October, 1998 and "Dopant Redistribution in SOI during RTA: A Study on Doping in Scaled-down Si Layers", Park et al. IEDM 1999 pp. 337–340, incorporated herein by reference).

As CMOS devices are scaled ever smaller, balancing the threshold voltage and drive currents between the PMOS and NMOS devices which employ different doping species becomes increasingly challenging. There is also a challenge in obtaining desired device characteristics with aggressively scaled memory arrays, for example, where a portion comprises memory device circuits and a portion comprises interface logic circuits. Thus, from the foregoing it can be appreciated that there is an ongoing need for a method of fabricating aggressively scaled SOI CMOS devices while reducing short channel effects such as DIBL without degrading overall device performance or requiring compensating implants, such as at the source and drain. There is a farther need for reducing DIBL in deep sub-micron CMOS devices without incurring significant additional processing steps and high temperature processing to manage manufacturing costs and process yield. There is also a need for processing methods that provide the flexibility to address the challenges of obtaining desired device characteristics among n-type and p-type devices employing different dopant species which are aggressively scaled, such as by providing asymmetric device characteristics.

SUMMARY OF THE INVENTION

The aforementioned needs are satisfied by the invention which in one embodiment is a method for creating semiconductor transistor devices on a silicon-on-insulator (SOI) structure including a buried oxide (BOX) layer and an active layer above the BOX layer, the method comprising implanting n-type or p-type dopants into the active layer to create n-wells or p-wells respectively and so as to form device regions in the active layer, forming gate stacks on the device regions so as to define underlying channel regions, implanting dopants into the n-wells or p-wells so as to form source and drain regions such that the gate stacks substantially inhibit penetration of the dopants into the channel regions, forming a masking layer with openings at least partially over the gate stacks and so as to mask remaining regions of the SOI structure not underlying the gate stacks, implanting first additional dopants through the openings such that the additional dopants come to reside within the BOX layer underlying the channel regions so as to create localized borophosphosilicate glass (BPSG) diffusion sources within the BOX layer, implanting second threshold adjust dopants into the n-wells and p-wells to change a threshold voltage of the resulting transistor devices, and processing the SOI structure so as to induce the diffusion sources to establish retrograde dopant profiles in the channel regions having a peak concentration near the BOX.

In one embodiment, the openings of the mask layer are grouped to overlie only a portion of the SOI structure. The openings can be formed to overlie a central portion of the SOI structure and openings are not formed in a peripheral portion of the SOI structure. One embodiment further comprises forming a first set of the transistor devices adjacent the openings and defining an array of memory cells having a first set of transistor device characteristics and forming a second set of the transistor devices not underlying the openings defining peripheral logic access and control circuits having a second set of device characteristics. In one embodiment, the memory cells comprise DRAM cells.

In one embodiment, processing the SOI structure so as establish the retrograde dopant profiles comprises forming a passivation layer with attendant high temperature processing.

In one embodiment, the second threshold adjust dopants are implanted before forming the masking layer and in another the second threshold adjust dopants are implanted through the openings in the masking layer.

In one embodiment, the openings are formed to be asymmetric with respect to the source and drain regions such that asymmetric diffusion sources and asymmetric retrograde dopant profiles are formed and, in this embodiment, the asymmetric, retrograde dopant profiles can define asymmetric device characteristics for the transistor devices.

Another embodiment is a method for creating semiconductor transistor devices on a silicon-on-insulator (SOD) structure including a buried oxide (BOX) layer and an active layer above the BOX layer, the method comprising implanting n-type or p-type dopants into the active layer to create n-wells or p-wells respectively and so as to form device regions in the active layer, forming gate stacks on the device regions so as to define underlying channel regions, implanting dopants into the n-wells or p-wells so as to form source and drain regions such that the gate stacks substantially inhibit penetration of the dopants into the channel regions, forming a masking layer with asymmetric openings at least partially over the gate stacks and so as to mask remaining regions of the SOI structure not underlying the gate stacks, implanting first additional dopants through the openings such that the additional dopants come to reside within the BOX layer underlying the channel regions so as to create asymmetric borophosphosilicate glass (BPSG) diffusion sources within the BOX layer, and processing the SOI structure so as to induce the diffusion sources to establish asymmetric retrograde dopant profiles in the channel regions having a peak concentration near the BOX.

In one embodiment, the openings of the mask layer are grouped to overlie only a portion of the SOI structure. In one embodiment, the openings are formed to overlie a central portion of the SOI structure and openings are not formed in a peripheral portion of the SOI structure.

One embodiment comprises forming a first set of the transistor devices adjacent the openings and defining an array of memory cells having a first set of transistor device characteristics and forming a second set of the transistor devices not underlying the openings defining peripheral logic access and control circuits having a second set of device characteristics. In one embodiment, the memory cells comprise DRAM cells.

In one embodiment, processing the SOI structure so as establish the asymmetric retrograde dopant profiles comprises forming a passivation layer with attendant high temperature processing.

One embodiment further comprises implanting second threshold adjust dopants into the n-wells and p-wells to change a threshold voltage of the resulting transistor devices. In one embodiment, the second threshold adjust dopants are implanted before forming the masking layer and in another the threshold adjust dopants are implanted through the openings in the masking layer. In one embodiment, the asymmetric, retrograde dopant profiles define asymmetric device characteristics for the transistor devices.

Yet another embodiment is a method for creating semiconductor transistor devices on a silicon-on-insulator (SOI) structure including a buried oxide (BOX) layer and an active layer above the BOX layer, the method comprising implanting n-type or p-type dopants into the active layer to create n-wells or p-wells respectively and so as to form device regions in the active layer, forming gate stacks on the device regions so as to define underlying channel regions, implanting dopants into the n-wells or p-wells so as to form source and drain regions such that the gate stacks substantially inhibit penetration of the dopants into the channel regions, forming a masking layer with openings at least partially over the gate stacks and so as to mask remaining regions of the SOI structure not overlying the gate stacks, implanting first additional dopants through the openings such that the additional dopants come to reside within the BOX layer underlying the channel regions so as to create borophosphosilicate glass (BPSG) diffusion sources within the BOX layer, and processing the SOI structure so as to induce the diffusion sources to establish retrograde dopant profiles in the channel regions having a peak concentration near the BOX.

In one embodiment, the openings of the mask layer are grouped to overlie only a portion of the SOI structure. In one embodiment, the openings are formed to overlie a central portion of the SOI structure and openings are not formed in a peripheral portion of the SOI structure.

One embodiment comprises forming a first set of the transistor devices adjacent the openings and defining an array of memory cells having a first set of transistor device characteristics and forming a second set of the transistor devices not underlying the openings defining peripheral logic access and control circuits having a second set of device characteristics. In one embodiment, the memory cells comprise DRAM cells.

In one embodiment, processing the SOI structure so as establish the retrograde dopant profiles comprises forming a passivation layer with attendant high temperature processing.

One embodiment further comprises implanting second threshold adjust dopants into the n-wells and p-wells to change a threshold voltage of the resulting transistor devices. In one embodiment, the second threshold adjust dopants are implanted before forming the masking layer and in another the threshold adjust dopants are implanted through the openings in the masking layer.

In one embodiment, the openings are formed to be asymmetric with respect to the source and drain regions such that asymmetric diffusion sources and asymmetric retrograde dopant profiles are formed and the asymmetric, retrograde dopant profiles can define asymmetric device characteristics for the transistor devices.

A further embodiment is a semiconductor transistor device comprising a semiconductive substrate, an insulative layer buried within the semiconductive substrate, an active layer of semiconductive material above the insulative layer, a gate structure formed on the active layer, and source and drain regions formed in the active layer wherein the insulative layer is provided with a dopant diffusion source localized under the gate structure between the source and drain regions and wherein the dopant diffusion source is diffused into the active layer so as to define a retrograde dopant profile in the active layer under the gate stack substantially between the source and drain regions.

In one embodiment, the retrograde dopant profile has a peak concentration substantially adjacent the interface of the insulative layer and the active layer. In one embodiment, the retrograde dopant profile provides the transistor device with improved resistance to drain-induced barrier lowering (DIBL). In one embodiment, the retrograde dopant profile in the active layer is asymmetrically positioned with respect to the source and drain regions. In one embodiment, the active layer further comprises threshold adjust dopants positioned substantially between the source and drain regions and under the gate structure. In one embodiment, the insulative layer with dopant diffusion source comprises borophosphosilicate glass (BPSG). These and other objects and advantages of the present invention will become more fully apparent from the following description taken in conjunction with the accompanying drawings.

DETAILED DESCRIPTION OF THE PREFERRED EMBODIMENT

Figure 1:
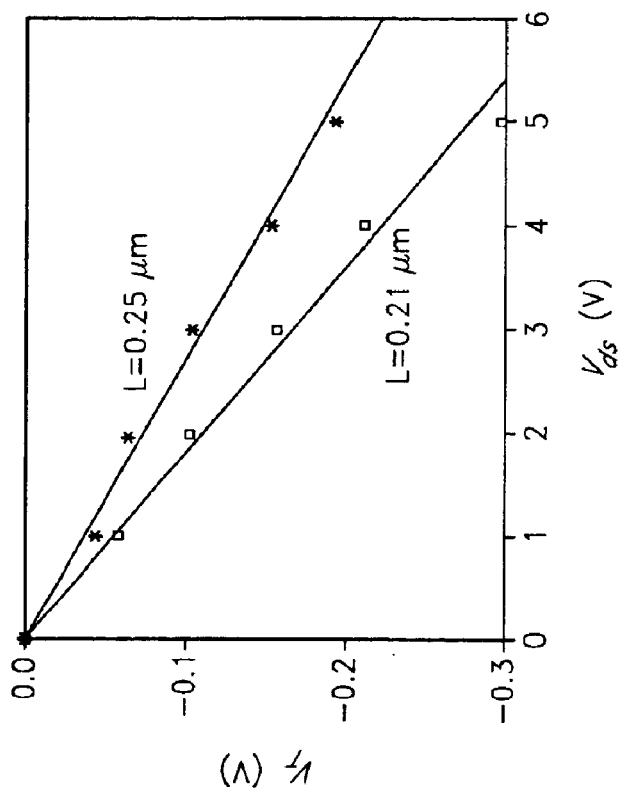
FIG. 1 is a graph illustrating prior art concerning DIBL as the relation of threshold voltage ($V_T$) to drain-source voltage ($V_{DS}$) for various sub-micron channel lengths.
Figure 3:
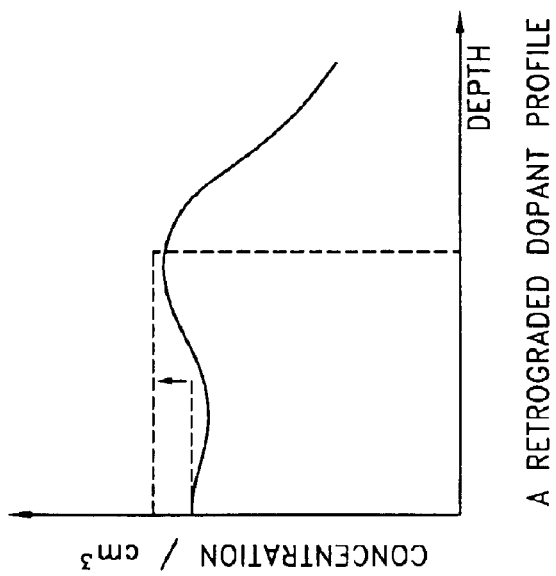
FIG. 3 is a graph illustrating prior art of a retrograde dopant profile in CMOS devices.
Figure 2:
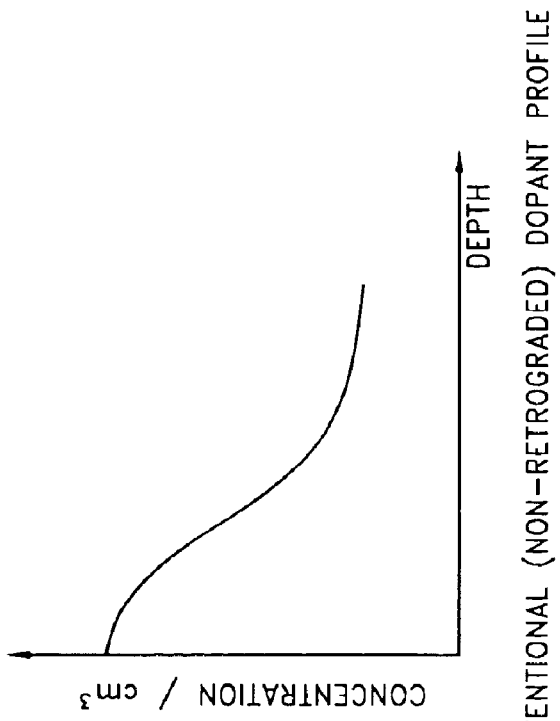
FIG. 2 is a graph illustrating prior art of a typical diffusion based dopant profile in CMOS devices.
Figure 4:
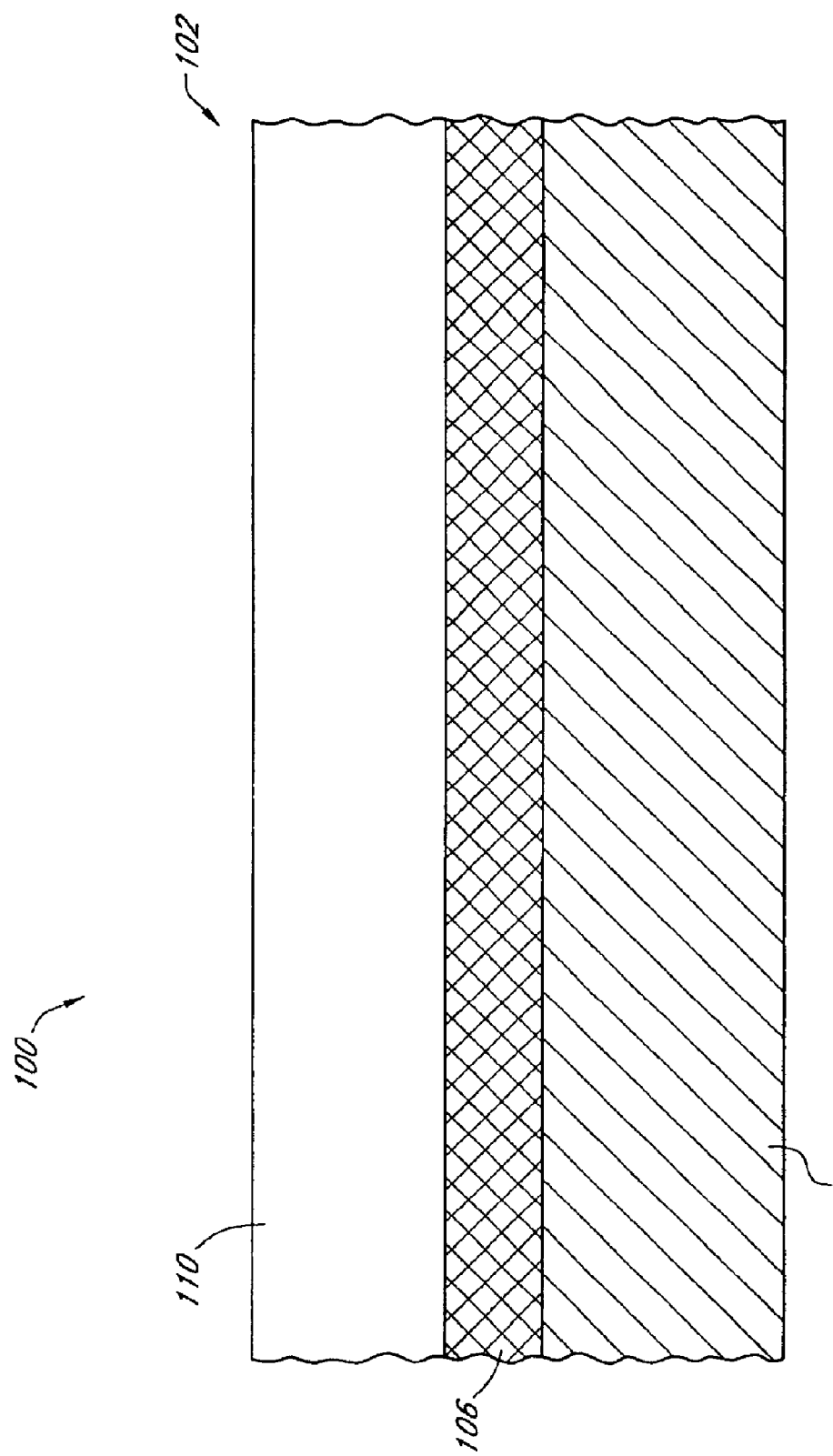
FIG. 4 is a section view of the starting material of the SOI CMOS with reduced DIBL, a SIMOX wafer.

Reference will now be made to the drawings wherein like numerals refer to like structures or processes throughout. FIG. 4 is a section view of one embodiment of a method 100 of forming SOI CMOS with reduced DIBL 130 (FIG. 9) showing the starting SOI material, a Separation by IMplanted OXygen (SIMOX) wafer 102. The SIMOX wafer 102 is well known in the art and comprises a silicon substrate 104 in which a layer of the substrate 104 is converted to a buried silicon dioxide (BOX) 106 layer with a heavy oxygen implant and subsequent anneal. An epitaxial layer 110 of Si approximately 500 Å to 2500 Å thick is then grown on top of the BOX layer 106. The BOX layer 106 of the SIMOX wafer 102 provides electrical insulation between the active region provided by the epitaxial layer 110 and the bulk silicon of the substrate 104. Thus, active devices formed in the epitaxial layer 110 are electrically isolated from the semiconductive substrate 104. The SIMOX wafer 102 also provides physical structure as well as reactive material for formation of the SOI CMOS with reduced DIBL 100 in a manner that will be described in greater detail below.

In the description of the SOI CMOS with reduced DIBL 100 that follows, a single CMOS 130 structure comprising PMOS 132 and NMOS 134 (FIG. 9) devices will be used to illustrate the invention. It should be appreciated that the process herein described for one CMOS 130 structures also applies to forming a plurality of SOI CMOS with reduced DIBL 100 structures. It should also be appreciated that the invention herein described can be modified by one skilled in the art to achieve a PMOS 132, an NMOS 134, or other technology employing the methods herein described without detracting from the spirit of the invention. It should also be understood that FIGS. 4–10 are illustrative and should not be interpreted as being to scale.

Figure 5:
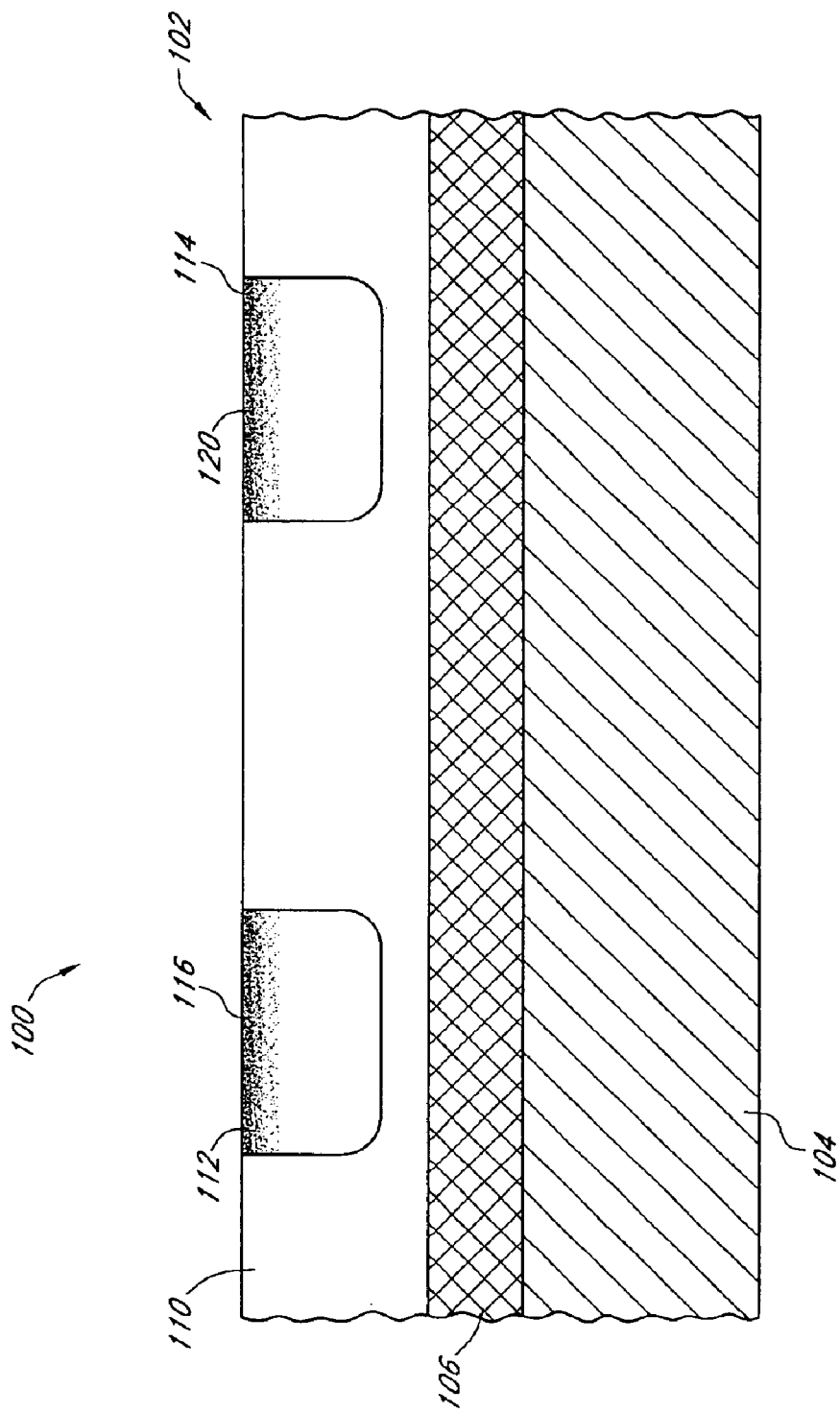
FIG. 5 is a section view of the SIMOX wafer with n- and p-type wells formed therein and a threshold voltage adjust implant into the wells.
Figure 9:
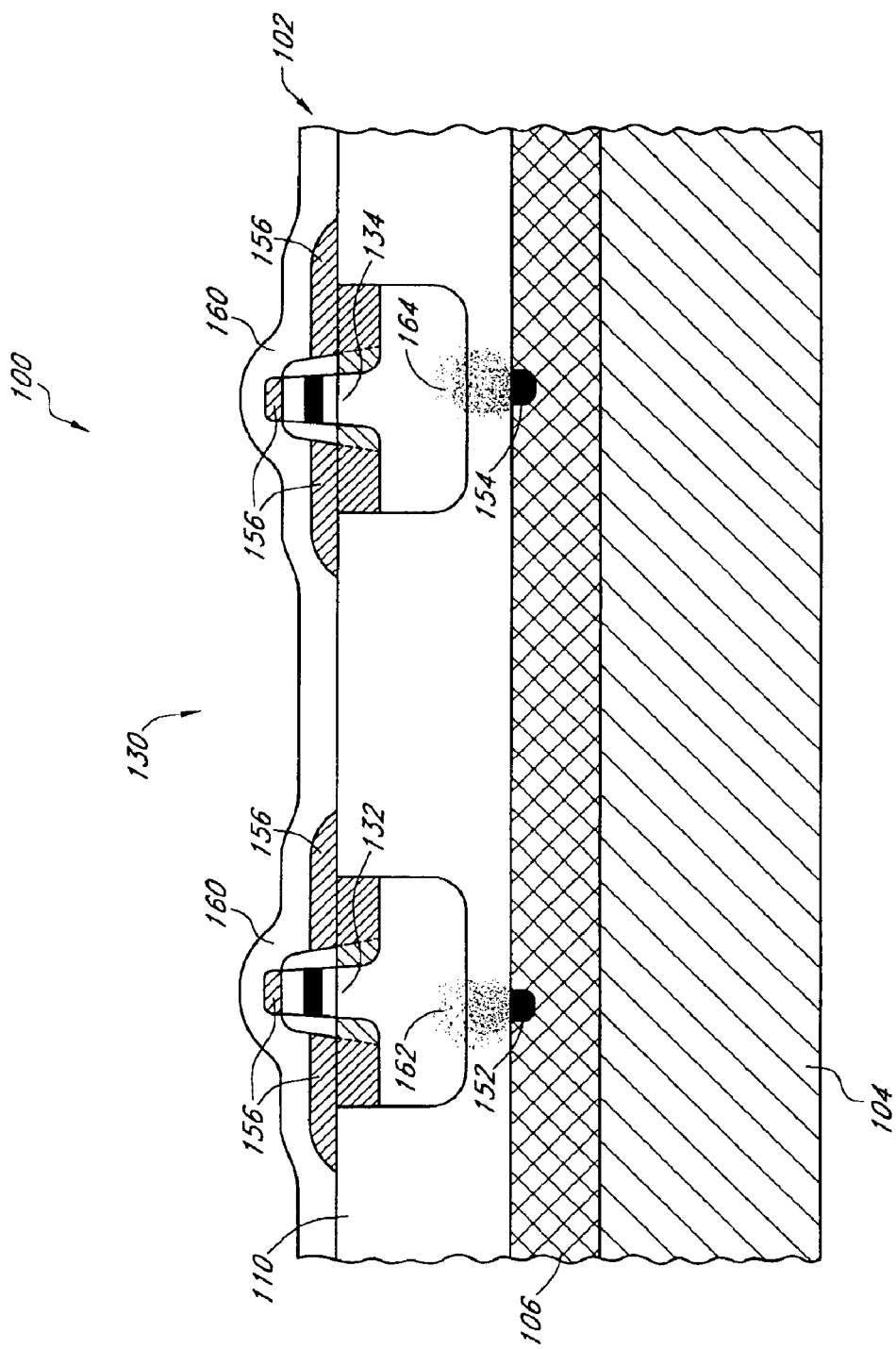
FIG. 9 is a section view of the SOI CMOS devices with conductive and passivation layers in place with the dopants entrained within the BPSG outdiffused into the n- and p-wells thereby forming a retrograde, asymmetric dopant profile within the wells that reduces DIBL.

The method of forming the SOI CMOS with reduced DIBL 100 also comprises creating n-well 112 and p-well 114 regions as shown in FIG. 5. The n-well 112 and p-well 114 regions are created, in this embodiment, by implanting a dose of approximately 1e13/cm$^2$ of P @ approximately 60 keV to create the n-well 112 and a dose of approximately 1e13/cm$^2$ of B @ approximately 30 keV to create the p-well 114. The n-well 112 and p-well 114 are then driven at a temperature of approximately 800° C. for a period of approximately 30 minutes. The n-well 112 and p-well 114 provide regions for the subsequent formation of the PMOS 132 and NMOS 134 devices that comprise a CMOS 130 structure (FIG. 9).

In one embodiment, the method of forming the SOI CMOS with reduced DIBL 100 also comprises threshold voltage ($V_t$) adjust implants 116, 120 as shown in FIG. 5. The threshold voltage adjust implants 116, 120 adjust the threshold voltage of the PMOS 132 and NMOS 134 devices respectively either upwards or downwards in a manner known in the art. The threshold voltage adjust implants 116, 120 comprise, in this embodiment, a PMOS gate adjust 116 implant of $BF_2$ at a dose of approximately 5e12 to 1e13 @ approximately 25–35 keV and an NMOS gate adjust 120 implant of Arsenic at a dose of approximately 5e12 to 1e13 @ approximately 35–50 keV. The PMOS gate adjust 116 and the NMOS gate adjust 120 modify the dopant concentration near the surface of the epitaxial layer 110 in the gate region of the PMOS 132 and NMOS 134 devices so as to adjust the resultant threshold voltage of the PMOS 132 and NMOS 134 devices to a desirable level.

Figure 6:
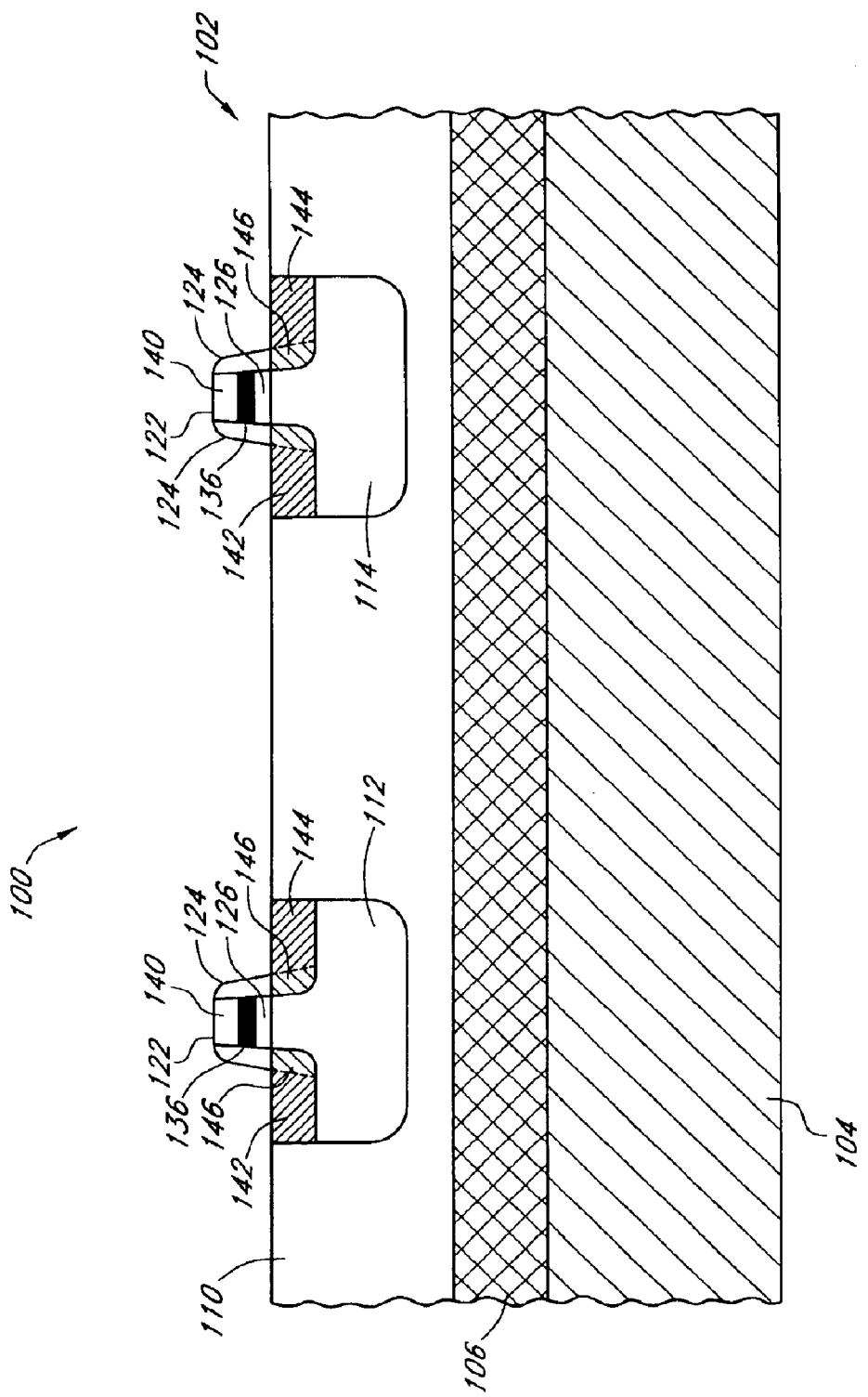
FIG. 6 is a section view of the SIMOX wafer with gate stacks formed on the n- and p-wells with source and drain implants.

The method of forming the SOI CMOS with reduced DIBL 100 also comprises formation of gate stacks 122 as shown in FIG. 6. In this embodiment, the gate stack 122 comprises sidewalls 124, a gate oxide 126, a nitride layer 136, and polysilicon 140. The sidewalls 124 comprise silicon dioxide that is grown and subsequently anisotropically etched in a known manner to create the structures illustrated in FIG. 6. The sidewalls 124 electrically isolate the gate stack 122 from subsequently formed source/drain conductive layers and facilitates formation of source/drain extensions 146 in a manner that will be described in greater detail below. The gate oxide 126 in this embodiment comprises a layer of silicon dioxide approximately 50 Å thick. The gate oxide 126 electrically isolates the n-well 112 and p-well 114 regions of the epitaxial silicon 110 from overlying conductive layers that will be described in greater detail below. The nitride layer 136 comprises a layer that is substantially silicon nitride approximately 450 Å thick emplaced in a known manner. The nitride layer 136 inhibits subsequent migration of subsequently placed dopants from the polysilicon layers 140.

The method of forming the SOI CMOS with reduced DIBL 100 also comprises formation of the source 142 and drain 144 as shown in FIG. 6. The source 142 and drain 144 are formed by implanting $BF_2$ with a dose of approximately 2e15/cm$^2$ @ approximately 15 keV for the PMOS 132 and As with a dose of approximately 2e15/cm$^2$ @ approximately 10 keV for the NMOS 134. As can be seen from FIG. 6, the implantation of the source 142 and drain 144 is partially masked by the gate stack 122, including the sidewalls 124, and results in source/drain extensions 146. The source/drain extensions 146 are lower concentration regions of the source 142 and drain 144 that partially extend under the sidewalls 124. The source/drain extensions 146 reduce the peak electric field under the gate stacks 122 and thus reduce hot carrier effects in a known manner.

Figure 7:
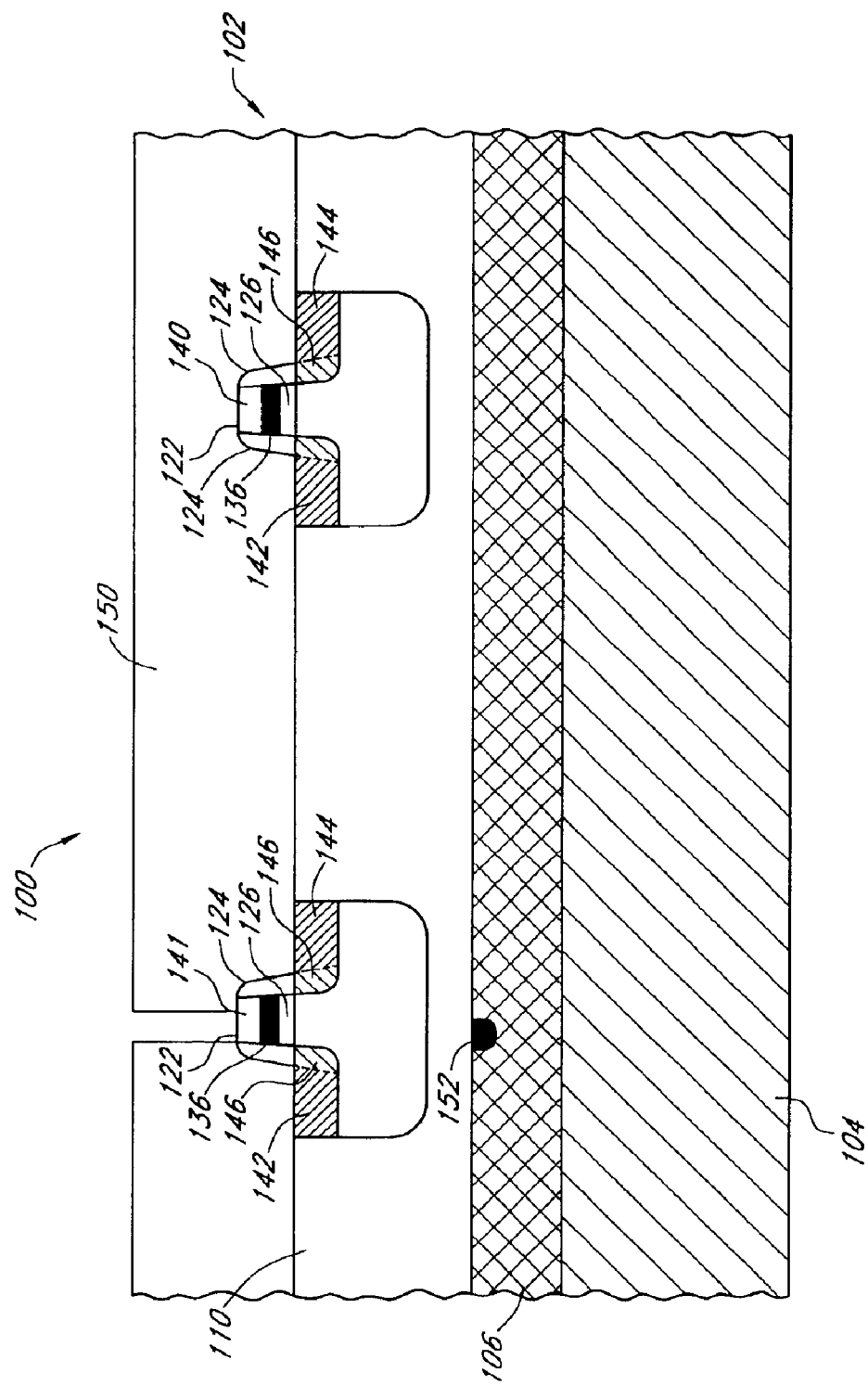
FIG. 7 is a section view of the SIMOX wafer with a mask level positioned thereon with asymmetric openings in the mask level substantially over gate stacks of the PMOS devices, but which are offset towards the source side and a high dose, high energy implant into the buried oxide (BOX) forming a borophosphosilicate glass (BPSG) structure under the PMOS gate stacks and offset towards the source.
Figure 8:
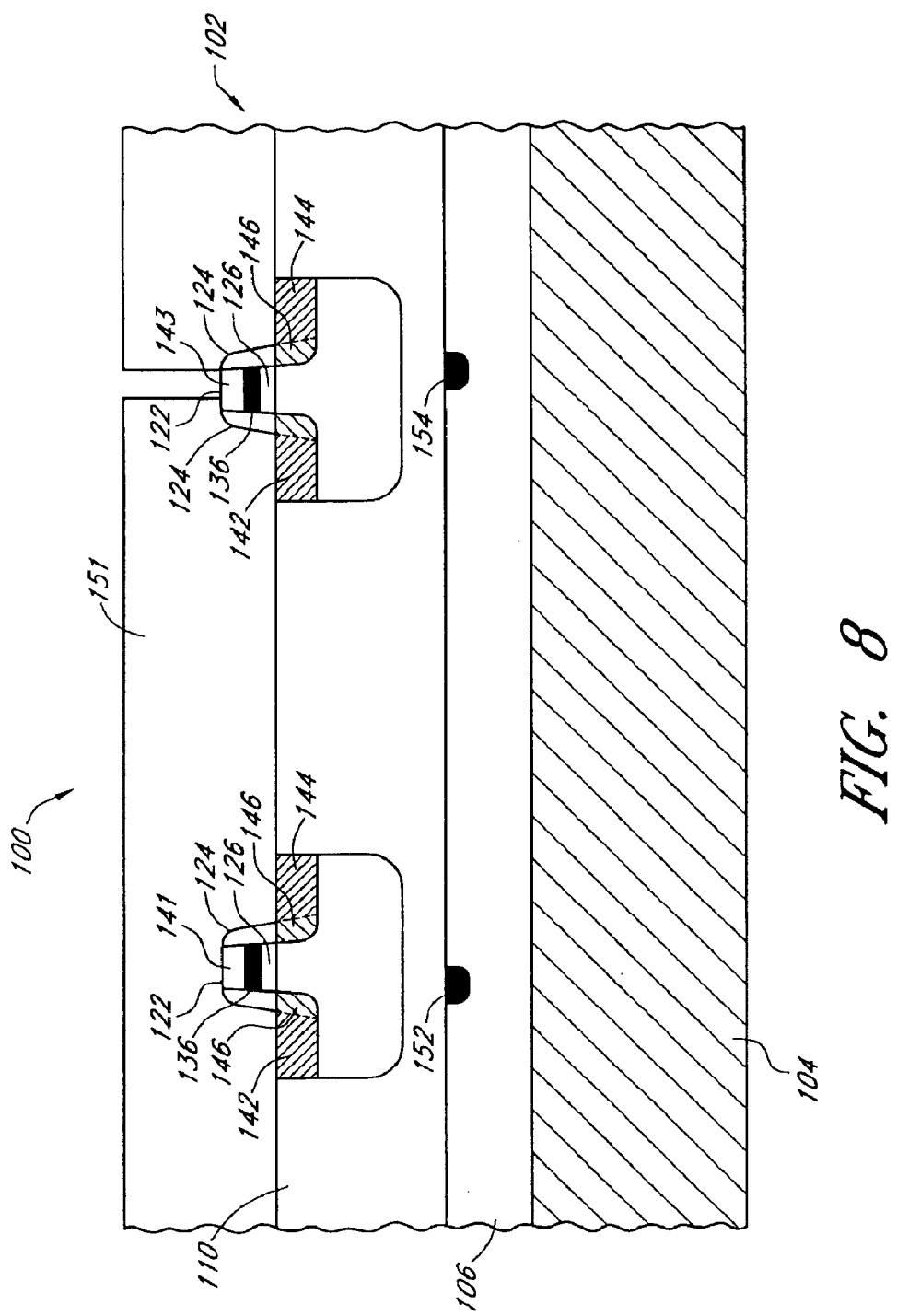
FIG. 8 is a section view of the SIMOX wafer with a similar mask level, but with asymmetric openings substantially over the NMOS gate stacks, but offset towards the drain side and a corresponding implant into the buried oxide (BOX) forming a borophosphosilicate glass (BPSG) structure under the NMOS gate stacks, offset towards the drain.

The method 100 also comprises forming mask levels 150, 151 as shown in FIGS. 7 and 8. The mask levels 150, 151 comprise photoresist layers formed, in this embodiment, with openings at least partially overlying the gate stacks 122 in a well known manner. Mask level 150 is formed, in this embodiment, with openings over the gate stacks 122 over the n-wells 112 with the openings biased towards the source side as shown in FIG. 7. Thus, in this embodiment, the openings extend substantially to the sidewall 124 on the source side, but not fully to the sidewall 124 on the drain side such that the mask layer 150 exposes the medial portion, but masks the outer portion of the gate stack 122 on the drain side. Thus, the openings in the mask layer 150 are asymmetric with respect to the source 142 and drain 144.

The method 100 also comprises doping the polysilicon 140 such that the polysilicon 140 becomes heavily p-type doped polysilicon 141 for the PMOS 132 device. In this embodiment, the doping to form the doped poly 141 comprises approximately 2e15/cm$^2$ of Boron or $BF_2$ @ approximately 3 keV.

In a complementary manner, mask level 151 is formed, in this embodiment, with openings at least partially overlying the gate stacks 122 over the p-wells 114 with the openings biased towards the drain side as shown in FIG. 8. Thus, in this embodiment, the openings extend substantially to the sidewall 124 on the drain side, but not fully to the sidewall 124 on the source side such that the mask level 151 exposes the medial portion, but masks the outer portion of the gate stack 122 on the source side. The polysilicon 140 of the NMOS 134 is doped with approximately 2e15/cm$^2$ of arsenic or phosphorus @ approximately 10 keV or 2 keV respectively to form n-type doped polysilicon 143 for the NMOS 134. The doped polysilicon 141, 143 provides a reduced work function for the gates of the PMOS 132 and NMOS 134 (FIG. 9) and thus a lower contact resistance and corresponding faster device response.

The method also comprises localized high energy, high dose implants to form an n-type diffusion source 152 and a p-type diffusion source 154. The implants are made into and through the n-well 112 and p-well 114 through the openings in the mask levels 150, 151 respectively as shown in FIGS. 7 and 8. The n-type diffusion source 152 and p-type diffusion sources 154 comprise borophosphosilicate glass (BPSG). The n-type diffusion source 152 and p-type diffusion source 154 implant parameters should be tailored in such a way that the resultant n-type diffusion source 152 and p-type diffusion source 154 dopant profiles mainly reside in the BOX layer 106, extend adjacent the upper surface thereof, and substantially inward of the overlying source and drain regions. Also, as the openings in the mask levels 150, 151 of this embodiment are asymmetric with respect to the source and drain, the resulting diffusion sources 152, 154 are also asymmetric.

In one embodiment, the n-type diffusion source 152 implant comprises a localized implant of phosphorus through the opening in the mask level 150 and through the n-well 112 of approximately 2.0e14/cm$^2$ @ 220 keV into the BOX layer 106. The p-type diffusion source 154 implant comprises a localized implant of boron through the opening in the mask level 151 and through the p-well 114 of approximately 2.0e14/cm$^2$ @ 100 keV into the BOX layer 106. In this embodiment, the final n-type diffusion source 152 and p-type diffusion source 154 dopant concentrations in the BOX 106 are preferably at least $10^{20}$cm$^{-3}$. The diffusion sources 152, 154 provide asymmetric sources of dopants that are localized under channel region defined under the gate stacks 122 in the BOX 106 and biased or offset towards the source or drain. The diffusion sources 152, 154, in this embodiment, also extend minimally under the source 142 and drain 144.

The method 100 of forming the SOI CMOS with reduced DIBL 130 then comprises formation of a conductive layer 156 (FIG. 9). In this embodiment, the conductive layer 156 comprises a layer of metallic silicide (titanium silicide or cobalt silicide) emplaced in a well known manner. The conductive layer 156 is placed so as to be in physical and electrical contact with the source 142, the drain 144, and the doped polysilicon 141, 143 of the gate stacks 122. The conductive layer 156 interconnects the PMOS 132 and NMOS 134 with other circuit devices on the SIMOX wafer 102 in a known manner.

The method of forming the SOI CMOS with reduced DIBL 100 then comprises formation of a passivation layer 160 (FIG. 9) overlying the structures previously described. In this embodiment, the passivation layer 160 comprises a layer of oxide, BPSG, or polysilicon approximately 3000 Å thick formed in a known manner. The formation of the passivation layer 160 involves a high temperature process.

The n-type diffusion source 152 and the p-type diffusion source 154 previously implanted into the BOX layer 106 in the manner described serve as solid-sources for dopant diffusion. When the passivation layer 160 is formed on the SIMOX wafer 102 with attendant heat steps, dopants contained in the n-type 152 and the p-type 154 diffusion sources will outdiffuse into the epitaxial silicon 110, creating thin, highly doped retrograde profile regions 162, 164 as shown in FIG. 9. The retrograde dopant profiles 162, 164 are also asymmetric between the source and drains which provides asymmetric device characteristics for the PMOS 132 and NMOS 134. In the case of the p-well 114, the retrograde profile region 162 will comprise boron and, in the n-well 112, the retrograde profile region 164 will comprise phosphorus. The retrograde profile regions 162, 164 will act as a punchthrough inhibition layer to control DIBL. The retrograde dopant profile regions 162, 164 are also localized under the channel/gate stack and do not significantly increase the concentration in the source or drain regions, thus avoiding undesirable effects such as increased junction leakage, series resistance, and/or hot carrier effects.

Figure 10:
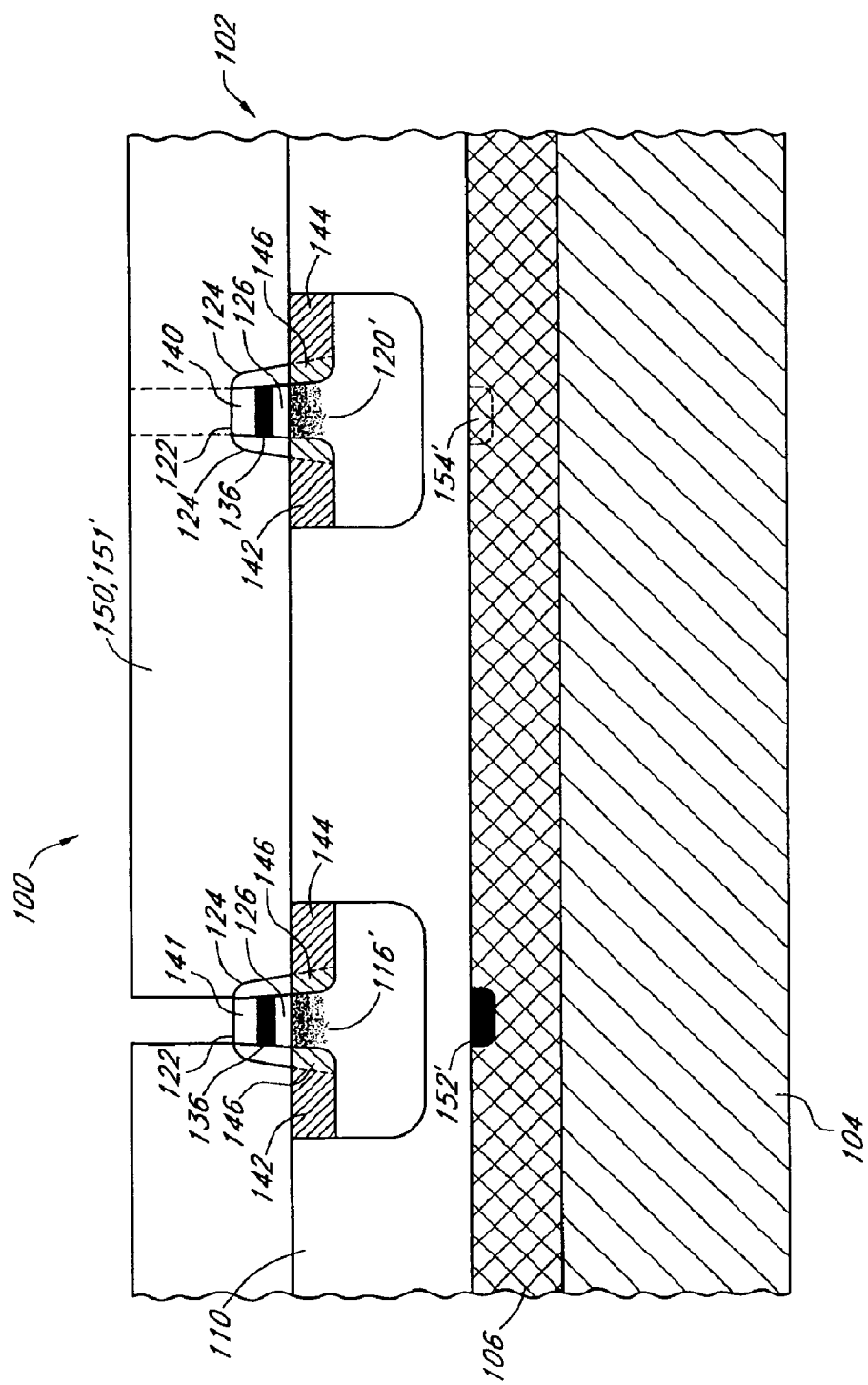
FIG. 10 illustrates another embodiment with a mask level similar to that of FIG. 7, but with substantially symmetric openings in the mask level and a high dose, high energy implant into the buried oxide (BOX) forming a borophosphosilicate glass (BPSG) structure under the PMOS gate stacks and a threshold adjust implant into the channel region.

FIG. 10 illustrates other embodiments of the invention, but which advantageously employ many of the processes, structures, and materials as previously described. These common aspects will not be repeated for brevity and ease of understanding. In the embodiment shown in FIG. 10, the method 100 is performed as previously described, however a mask level 150' is formed that is substantially similar to the mask level 150 except that in this embodiment, the mask level 150' has openings that are substantially symmetric with respect to the source 142 and drain 144. The openings still substantially overlie only the gate stacks 122 and mask remaining portions of the SOI structure 102. Diffusion sources 152', 154' are formed as previously described to form sources of dopants that are localized under the channel region defined under the gate stacks 122 in the BOX 106 and also extending minimally under the source 142 and drain 144, but which are substantially symmetric therebetween. In certain embodiments, a mask level 151' can also be formed and corresponding processes performed as previously described with respect to the mask level 151, but with general symmetry between the source and drain.

The embodiment of FIG. 10 also comprises threshold voltage ($V_t$) adjust implants 116', 120'. The threshold adjust implants 116', 120' are similar to the implants 116, 120 as shown in FIG. 5, except that in this embodiment, the implants 116', 120' are performed through the opening in the mask levels 150(150'), 151(151'). The threshold voltage adjust implants 116', 120' adjust the threshold voltage of the PMOS 132 and NMOS 134 devices respectively either upwards or downwards, but are more localized to the channel region. The threshold adjust implants can be either asymmetric with respect to the source and drain when preformed through opening in the mask levels 150, 151 or substantially symmetric when preformed through the mask levels 150', 151'.

The threshold voltage adjust implants 116', 120' comprise, in this embodiment, a PMOS gate adjust 116' implant of $BF_2$ or boron at a dose of approximately 5e12 to 1e13/cm² @ approximately 10–50 keV and an NMOS gate adjust 120' implant of Arsenic at a dose of approximately 5e12 to 1e13/cm² @ approximately 10–30 keV. The PMOS gate adjust 116' and the NMOS gate adjust 120' modify the dopant concentration near the surface of the epitaxial layer 110 in the gate region of the PMOS 132 and NMOS 134 devices so as to adjust the resultant threshold voltage of the PMOS 132 and NMOS 134 devices to a desirable level. An advantage of the threshold adjust implants 116', 120' is that they are more localized to the channel regions where desired with remaining areas masked, thus reducing possible undesirable effects on other regions of the SOI structure 102. Thus, the openings in the mask levels 150(150'), 151(151') can be advantageously employed to perform first and second implants that target localized regions and mask the remainder of the SOI structure 102.

Figure 12:
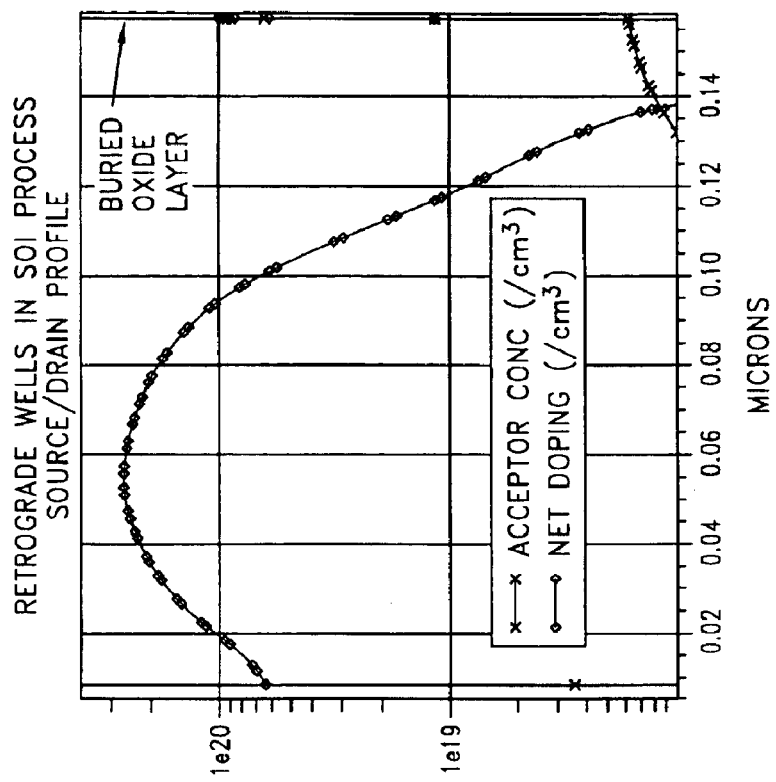
FIG. 12 is a graph illustrating the net dopant concentration in the source/drain regions of a SOI CMOS according to aspects of the invention as a function of depth into the substrate from the surface to the buried oxide layer.
Figure 11:
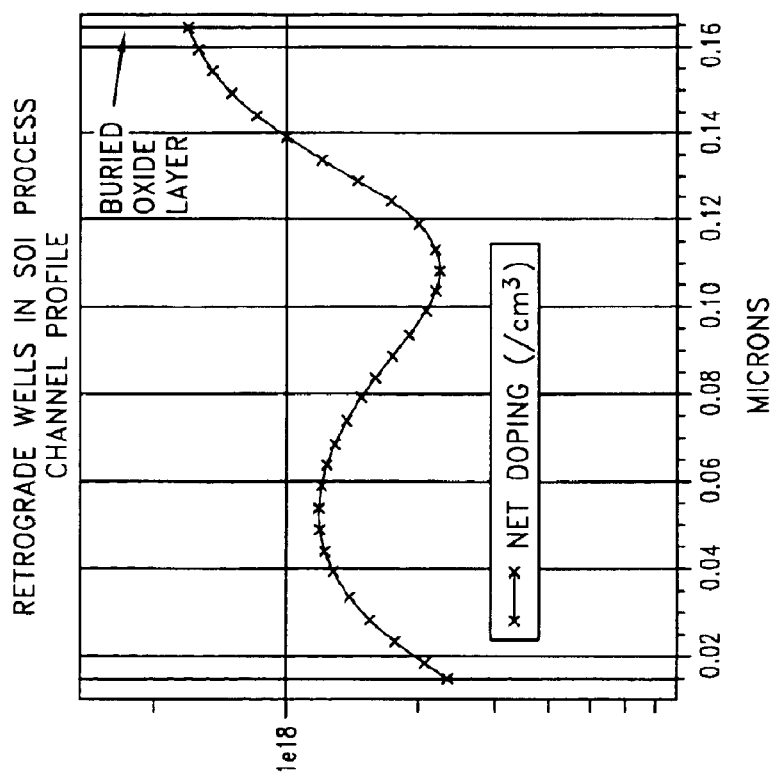
FIG. 11 is a graph illustrating the net dopant concentration in the channel (gate) region of a SOI CMOS according to aspects of the invention as a function of depth into the substrate from the surface to the buried oxide layer.

FIG. 11 shows the net dopant profile in a vertical outline in the middle of the channel region. The boron concentration increases from 9.0e17/cm³ to 2.0e18/cm³, which is nearly a 120% increase, at the BOX 106/silicon substrate 104 interface. FIG. 12 shows the dopant profile in the source 142 and drain 144 regions. The source 142 and drain 144 implants in this embodiment of the SOI CMOS with reduced DIBL 130 reach close to the BOX layer 106 as can be seen from FIG. 12. As such the source 142 and drain 144 implants will compensate the outdiffused dopants from the n-type 152 and p-type 154 diffusion sources in the retrograde profile regions 162, 164 close to the interface of the BOX 106 and the silicon substrate 104. This will reduce the junction capacitance of the SOI CMOS with reduced DIBL 130 even further as compared to a process with halo implants.

The dopants contained within the retrograde profile regions 162, 164 will also create recombination centers near the BOX 106/silicon substrate 104 interface. These recombination centers are an added benefit in the SOI CMOS with reduced DIBL 130 since the recombination centers tend to reduce the floating body effects in the SOI CMOS with reduced DIBL 130.

Hence, the process of the illustrated embodiments provides a method 100 with which a localized retrograde doping profiles 162, 164 can be created in thin semiconductor active areas such as the active areas used in silicon-on-insulator (SOI) applications and, more particularly, substantially in the channel, underneath the gate. The process of the illustrated embodiment does not significantly add to the processing of the device as only discrete implantation steps are required and the diffusion is obtained through thermal processing of the device which is part of standard processes. Thus, localized retrograde profiles 162, 164 can be created in a manner that does not significantly increase the processing costs of the device.

The method 100 also provides the ability to readily create asymmetrical PMOS 132 and NMOS 134 devices that offer benefits in tailoring threshold voltages and other device characteristics. By biasing or offsetting the diffusion sources 152, 154 towards either of the source or drain, the resultant dopant profiles as the diffusion sources 152, 154 are asymmetric between the source and drain. The method also provides the advantage that single mask layers 150, 151 (150', 151') provide openings for both doping the polysilicon 140 to form doped poly 141, 143 for improved contact characteristics as well as forming the diffusion sources 152, 154 which provide the asymmetric PMOS 132 and NMOS 134 which reduces the need for additional masking steps.

Advantages offered by asymmetric devices include creation of transistors with different threshold voltage and saturation current characteristics compared to symmetric devices without requiring any additional mask level, thus simplifying and speeding the production process. They can also provide more flexibility to the circuit designer. In high-level circuit designs, where devices operate in a uni-directional mode, e.g., there is a well defined 'source' (low potential) and 'drain' (high potential), a punchthrough stop (or halo) implant can be formed only in the source, region. This improves the performance of the device by keeping a low off-state leakage (due to reduced drain-induced barrier lowering—DIBL) and high on-state current (due to high channel mobility in the drain region and low parasitic resistance in the drain overlap region).

An additional advantage is that the method 100 improves reliability of the devices 132, 134 by creating a slightly larger overlap area in the drain region compared to source region. This aspect inhibits formation of deep-depletion regions in the drain side, due to trapped high energy electrons in the overlying gate oxide. This aspect improves transconductance (mobility) after electrical stress. Yet another advantage is that the drain junction diode is graded to improve (reduce) drain leakage current. The lack of a halo in the drain side results in a lower boron concentration under the n+ region in an NMOS device (opposite for PMOS) and therefore a more graded junction. With a halo this junction is more abrupt and therefore results in a higher electric field.

Figure 13:
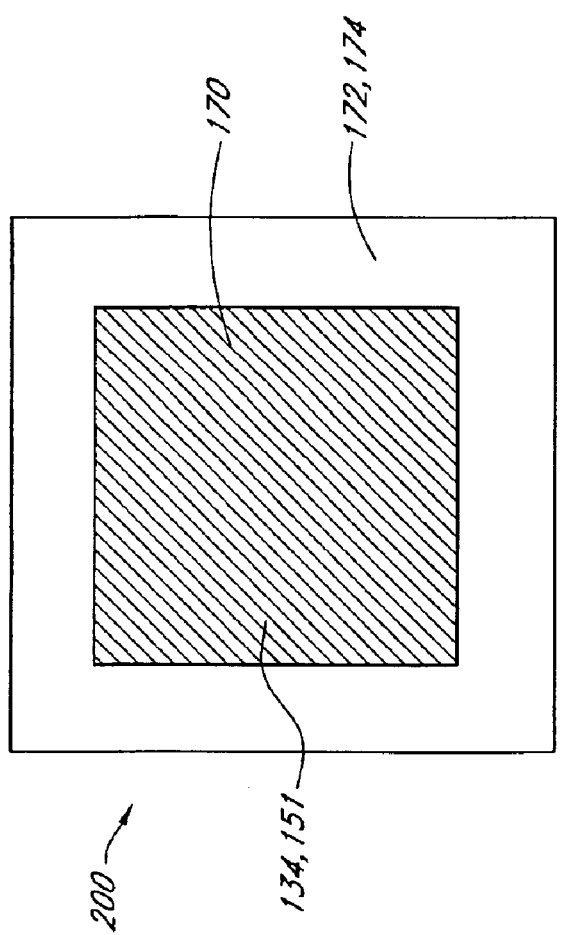
FIG. 13 is a top view of an array of memory cells, such as DRAM cells, with peripherally disposed logic circuits formed employing embodiments of the SOI CMOS with reduced DIBL.

FIG. 13 is a top view of a further embodiment of the invention. In particular, FIG. 13 is a top view of an array 170 of memory cells, such as DRAM cells surrounded with a peripheral array of logic circuits. A typical DRAM memory cell comprises a single transistor, such as an NMOS 134, and a storage capacitor interconnected in a well known circuit. The gate of the NMOS 134 is typically connected to a word line and the source or drain of the NMOS 134 is connected to a bit line. Peripheral logic circuits 172 provide the access functionality for read and write operations to the individual DRAM cells via interconnection to the various word and bit lines. A particular advantage of DRAM memory is that the DRAM memory cell is simple and compact and results in high memory density per unit area. DRAM circuits are typically near the leading edge of technology and employ some of the most aggressive scaling to reduce device size and increase the memory capacity. Thus, DRAM is an application that is particularly demanding for limiting short channel effects, such as DIBL.

As previously described, the method 100 can be utilized solely for NMOS 134 devices and FIG. 13 shows an example of such an application to DRAM memory. In particular, FIG. 13 shows a method 200 of creating SOI NMOS with reduced DIBL 134. In this embodiment, the mask level 151 with the corresponding openings is limited to the extent of the SIMOX wafer 102 to be used to form NMOS devices 134, in this embodiment generally the central portion. The peripheral logic circuits 172 are masked by a mask level 174 lacking the opening of the mask level 151 and the implants and processes previously described are performed with use of the mask levels 151, 174 to provide the retrograde profile region 164 to the NMOS devices 134 of the DRAM cells, but not to the peripheral logic circuits 172. In various aspects of the invention, the mask level 151 is biased towards the source 142 or drain 144 to create asymmetric NMOS devices 134 or is generally symmetric and centered over the gate stack 122 of the NMOS devices 134. This aspect of the invention provides additional flexibility in the manufacture of NMOS devices 134 to be formed with optimized characteristics for a particular application, such as the present DRAM example.

Although the preferred embodiments of the present invention have shown, described and pointed out the fundamental novel features of the invention as applied to those embodiments, it will be understood that various omissions, substitutions and changes in the form of the detail of the device illustrated may be made by those skilled in the art without departing from the spirit of the present invention. Consequently, the scope of the invention should not be limited to the foregoing description but is to be defined by the appended claims.

What is claimed is:

1. A method for creating semiconductor transistor devices on a silicon-on-insulator (SOI) structure including a buried oxide (BOX) layer and an active layer above the BOX layer, the method comprising:

implanting n-type or p-type dopants into the active layer to create n-wells or p-wells respectively and so as to form device regions in the active layer;

forming gate stacks on the device regions so as to define underlying channel regions;

implanting dopants into the n-wells or p-wells so as to form source and drain regions such that the gate stacks substantially inhibit penetration of the dopants into the channel regions;

forming a masking layer with openings at least partially over the gate stacks and so as to mask remaining regions of the SOI structure not underlying the gate stacks;

implanting first additional dopants through the openings such that the additional dopants come to reside within the BOX layer underlying the channel regions so as to create localized borophosphosilicate glass (BPSG) diffusion sources within the BOX layer;

implanting second threshold adjust dopants into the n-wells and p-wells to change a threshold voltage of the resulting transistor devices; and processing the SOI structure so as to induce the diffusion sources to establish retrograde dopant profiles in the channel regions having a peak concentration near the BOX.

2. The method of claim 1, wherein the openings of the mask layer are grouped to overlie only a portion of the SOI structure.

3. The method of claim 2, wherein the openings are formed to overlie a central portion of the SOI structure and openings are not formed in a peripheral portion of the SOI structure.

4. The method of claim 2, comprising forming a first set of the transistor devices adjacent the openings and defining an array of memory cells having a first set of transistor device characteristics and forming a second set of the transistor devices not underlying the openings defining peripheral logic access and control circuits having a second set of device characteristics.

5. The method of claim 4, wherein the memory cells comprise DRAM cells.

6. The method of claim 1, wherein processing the SOI structure so as to establish the retrograde dopant profiles comprises forming a passivation layer with attendant high temperature processing.

7. The method of claim 1, wherein the second threshold adjust dopants are implanted before forming the masking layer.

8. The method of claim 1, wherein the second threshold adjust dopants are implanted through the openings in the masking layer.

9. The method of claim 1, wherein the openings are formed to be asymmetric with respect to the source and drain regions such that asymmetric diffusion sources and asymmetric retrograde dopant profiles are formed.

10. The method of claim 9, wherein the asymmetric, retrograde dopant profiles define asymmetric device characteristics for the transistor devices.

11. A method for creating semiconductor transistor devices on a silicon-on-insulator (SOI) structure including a buried oxide (BOX) layer and an active layer above the BOX layer, the method comprising:
   implanting n-type or p-type dopants into the active layer to create n-wells or p-wells respectively and so as to form device regions in the active layer;
   forming gate stacks on the device regions so as to define underlying channel regions;
   implanting dopants into the n-wells or p-wells so as to form source and drain regions such that the gate stacks substantially inhibit penetration of the dopants into the channel regions;
   forming a masking layer with asymmetric openings at least partially over the gate stacks and so as to mask remaining regions of the SOI structure not underlying the gate stacks;
   implanting first additional dopants through the openings such that the additional dopants come to reside within the BOX layer underlying the channel regions so as to create asymmetric borophosphosilicate glass (BPSG) diffusion sources within the BOX layer; and
   processing the SOI structure so as to induce the diffusion sources to establish asymmetric retrograde dopant profiles in the channel regions having a peak concentration near the BOX.

12. The method of claim 11, wherein the openings of the mask layer are grouped to overlie only a portion of the SOI structure.

13. The method of claim 12, wherein the openings are formed to overlie a central portion of the SOI structure and openings are not formed in a peripheral portion of the SOI structure.

14. The method of claim 12, comprising forming a first set of the transistor devices adjacent the openings and defining an array of memory cells having a first set of transistor device characteristics and forming a second set of the transistor devices not underlying the openings defining peripheral logic access and control circuits having a second set of device characteristics.

15. The method of claim 14, wherein the memory cells comprise DRAM cells.

16. The method of claim 11, wherein processing the SOI structure so as establish the asymmetric retrograde dopant profiles comprises forming a passivation layer with attendant high temperature processing.

17. The method of claim 11, further comprising implanting second threshold adjust dopants into the n-wells and p-wells to change a threshold voltage of the resulting transistor devices.

18. The method of claim 17, wherein the second threshold adjust dopants are implanted before forming the masking layer.

19. The method of claim 17, wherein the threshold adjust dopants are implanted through the openings in the masking layer.

20. The method of claim 11, wherein the asymmetric, retrograde dopant profiles define asymmetric device characteristics for the transistor devices.

21. A method for creating semiconductor transistor devices on a silicon-on-insulator (SOI) structure including a buried oxide (BOX) layer and an active layer above the BOX layer, the method comprising:
   implanting n-type or p-type dopants into the active layer to create n-wells or p-wells respectively and so as to form device regions in the active layer;
   forming gate stacks on the device regions so as to define underlying channel regions;
   implanting dopants into the n-wells or p-wells so as to form source and drain regions such that the gate stacks substantially inhibit penetration of the dopants into the channel regions;
   forming a masking layer with openings at least partially over the gate stacks and so as to mask remaining regions of the SOI structure not overlying the gate stacks;
   implanting first additional dopants through the openings such that the additional dopants come to reside within the BOX layer underlying the channel regions so as to create borophosphosilicate glass (BPSG) diffusion sources within the BOX layer; and
   processing the SOI structure so as to induce the diffusion sources to establish retrograde dopant profiles in the channel regions having a peak concentration near the BOX.

22. The method of claim 21, wherein the openings of the mask layer are grouped to overlie only a portion of the SOI structure.

23. The method of claim 22, wherein the openings are formed to overlie a central portion of the SOI structure and openings are not formed in a peripheral portion of the SOI structure.

24. The method of claim 22, comprising forming a first set of the transistor devices adjacent the openings and defining an array of memory cells having a first set of transistor device characteristics and forming a second set of the transistor devices not underlying the openings defining peripheral logic access and control circuits having a second set of device characteristics.

25. The method of claim 24, wherein the memory cells comprise DRAM cells.

26. The method of claim 21, wherein processing the SOI structure so as establish the retrograde dopant profiles comprises forming a passivation layer with attendant high temperature processing.

27. The method of claim 21, further comprising implanting second threshold adjust dopants into the n-wells and swells to change a threshold voltage of the resulting transistor devices.

28. The method of claim 27, wherein the second threshold adjust dopants are implanted before forming the masking layer.

29. The method of claim 27, wherein the threshold adjust dopants arc implanted through the openings in the masking layer.

30. The method of claim 21, wherein the openings are formed to be asymmetric with respect to the source and drain regions such that asymmetric diffusion sources and asymmetric retrograde dopant profiles are formed.

31. The method of claim 30, wherein the asymmetric, retrograde dopant profiles define asymmetric device characteristics for the transistor devices.

32. A method for creating semiconductor transistor devices on a silicon-on-insulator (SOI) structure including a buried oxide (BOX) layer and an active layer above the BOX layer, the method comprising:

implanting n-type or p-type dopants into the active layer to create n-wells or p-wells respectively and so as to form device regions in the active layer;

forming gate stacks on the device regions so as to define underlying channel regions;

implanting dopants into the n-wells or p-wells so as to form source and drain regions such that the gate stacks substantially inhibit penetration of the dopants into the channel regions;

implanting first additional dopants through the gate stacks such that the additional dopants come to reside within the BOX layer underlying the channel regions and substantially between the source and drain regions so as to create borophosphosilicate glass (BPSG) diffusion sources within the BOX layer; and processing the SOI structure so as to induce the diffusion sources to establish retrograde dopant profiles in the channel regions having a peak concentration near the BOX.

33. The method of claim 32, further comprising forming a masking layer with openings at least partially over the gate stacks and so as to mask remaining regions of the SOI structure not overlying the gate stacks and wherein implanting the first additional dopants through the gate stacks comprises implanting the first additional dopants through the openings.

34. The method of claim 33, wherein the openings are formed to be asymmetric with respect to the source and drain regions such that asymmetric diffusion sources and asymmetric retrograde dopant profiles are formed.

35. The method of claim 34, wherein the asymmetric, retrograde dopant profiles define asymmetric device characteristics for the transistor devices.

36. The method of claim 32, wherein processing the SOI structure so as establish the retrograde dopant profiles comprises forming a passivation layer with attendant high temperature processing.

37. The method of claim 32, further comprising implanting second threshold adjust dopant into the n-wells and p-wells to change a threshold voltage of the resulting transistor device.

38. The method of claim 37, wherein the second threshold adjust dopants are implanted through the gate stacks.

* * * * *

UNITED STATES PATENT AND TRADEMARK OFFICE
CERTIFICATE OF CORRECTION

PATENT NO. : 6,872,640 B1
DATED : March 29, 2005
INVENTOR(S) : Mouli

It is certified that error appears in the above-identified patent and that said Letters Patent is hereby corrected as shown below:

Column 1,
Line 7, delete "(SI)" and insert -- SOI --.

Column 2,
Line 47, delete "farther" and insert -- further --.

Column 3,
Line 45, delete "(SOD)" and insert -- SOI --.

Column 14,
Line 58, delete "swells" and insert -- p-wells --.
Line 64, delete "arc" and insert -- are --.

Column 16,
Line 21, delete "dopant" and insert -- dopants --.
Line 23, delete "device" and insert -- devices --.

Signed and Sealed this

Eleventh Day of October, 2005

JON W. DUDAS
*Director of the United States Patent and Trademark Office*